(12) United States Patent
Kojima et al.

(10) Patent No.: US 7,642,797 B2
(45) Date of Patent: Jan. 5, 2010

(54) POWER SUPPLY STABILIZING CIRCUIT, AN ELECTRONIC DEVICE AND A TEST APPARATUS

(75) Inventors: Shoji Kojima, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 12/202,436

(22) Filed: Sep. 2, 2008

(65) Prior Publication Data
US 2009/0058381 A1 Mar. 5, 2009

(30) Foreign Application Priority Data
Sep. 4, 2007 (JP) .............................. 2007-228726

(51) Int. Cl.
*G01R 31/26* (2006.01)
(52) U.S. Cl. .................. 324/763; 324/765; 324/73.1
(58) Field of Classification Search ................... None
See application file for complete search history.

(56) References Cited

U.S. PATENT DOCUMENTS 5,448,188 A * 9/1995 Matsumoto et al. ........... 327/65

7,355,480 B2 * 4/2008 Honda ........................ 330/296

FOREIGN PATENT DOCUMENTS

JP 7-333249 12/1995

* cited by examiner

*Primary Examiner*—Minh N Tang
(74) *Attorney, Agent, or Firm*—Jianq Chyun IP Office

(57) ABSTRACT

There is provided a power supply stabilizing circuit provided in a chip of an electronic device. The power supply stabilizing circuit stabilizes a power supply voltage supplied to an operational circuit of the electronic device, and includes a current bypass section that supplies a bypass current from an auxiliary power supply interconnection to a main power supply interconnection, where the main power supply interconnection supplies the power supply voltage to the operational circuit, and the auxiliary power supply interconnection is different from the main power supply interconnection, and a current control section that varies an amount of the bypass current supplied by the current bypass section to the main power supply interconnection in accordance with a predetermined current variation pattern, under an external control, during an operation of the operational circuit.

13 Claims, 12 Drawing Sheets

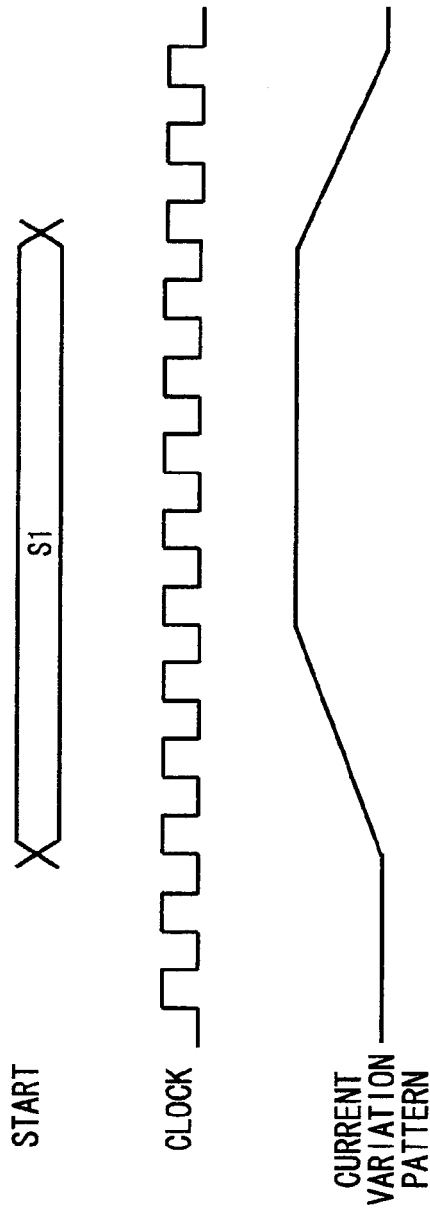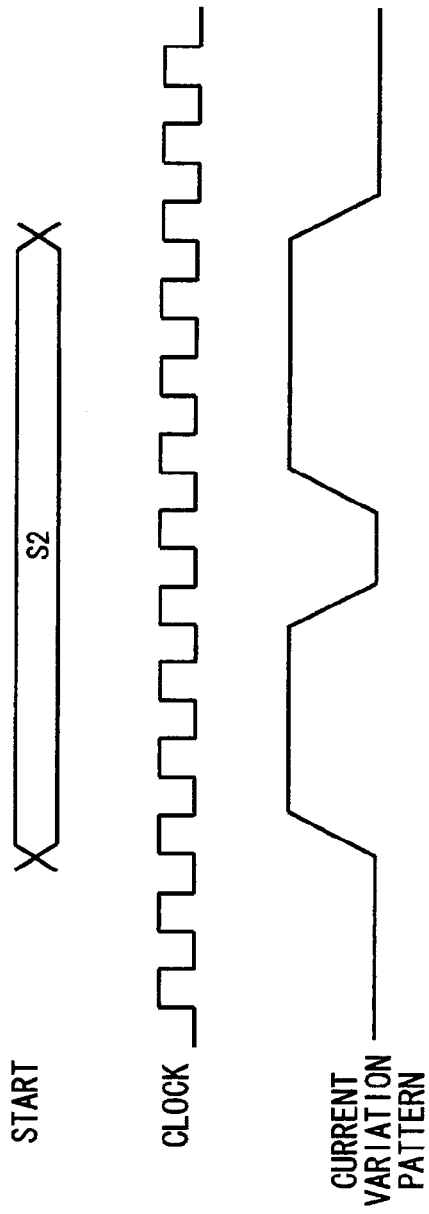

ated from the following description of the embodiments. The summary clause does not necessarily describe all necessary features of the embodiments of the present invention. The present invention may also be a sub-combination of the features described above.

POWER SUPPLY STABILIZING CIRCUIT, AN ELECTRONIC DEVICE AND A TEST APPARATUS

CROSS REFERENCE TO RELATED APPLICATION

The present application claims priority from a Japanese Patent Application No. 2007-228726 filed on Sep. 4, 2007, the contents of which are incorporated herein by reference.

BACKGROUND

1. Technical Field

The present invention relates to a power supply stabilizing circuit, an electronic device and a test apparatus. More particularly, the present invention relates to a power supply stabilizing circuit for stabilizing a power supply voltage to be supplied to an operational circuit of an electronic device, an electronic device with the power supply stabilizing circuit built-in, and a test apparatus using the power supply stabilizing circuit.

2. Related Art

To stabilize a power supply voltage to be supplied to an operational circuit of an electronic device such as a semiconductor circuit, it is known in the art to connect a pass capacitor to a power supply interconnection, for example, as disclosed in Japanese Patent Application Publication No. 07-333249. The pass capacitor is generally positioned, outside the chip of the electronic device, between the power supply interconnection that supplies power to the electronic device and the ground potential.

The pass capacitor reduces the variation in the current flowing through the power supply interconnection by supplying a current determined in accordance with the variation in the consumption current of the electronic device, to the electronic device via a power supply input terminal. In this way, the pass capacitor can reduce the variation in the power supply voltage due to the variation in the current. Generally, the pass capacitor used in the above manner has a capacitance of approximately several dozen nF to several µF.

Here, the power supply voltage may vary according to the variation in the consumption current of the operational circuit, also in the interconnection between the power supply input terminal of the electronic device and the operational circuit. This variation in the power supply voltage cannot be compensated for by the pass capacitor provided outside the chip of the electronic device.

To solve this issue, a similar pass capacitor may be provided also within the chip of the electronic device. To realize such a capacitor within the chip of the electronic device, the gate capacitance of a transistor may be utilized. A single transistor, however, has a gate capacitance of approximately several fF. Therefore, a very large number of elements need to be formed to implement a pass capacitor within the chip.

SUMMARY

Therefore, it is an object of an aspect of the innovations herein to provide a power supply stabilizing circuit, an electronic device and a test apparatus which are capable of overcoming the above drawbacks accompanying the related art. The above and other objects can be achieved by combinations described in the independent claims. The dependent claims define further advantageous and exemplary combinations of the innovations herein.

According to the first aspect related to the innovations herein, one exemplary power supply stabilizing circuit may be provided in a chip of an electronic device. The power supply stabilizing circuit stabilizes a power supply voltage supplied to an operational circuit of the electronic device, and includes a current bypass section that supplies a bypass current from an auxiliary power supply interconnection to a main power supply interconnection, where the main power supply interconnection supplies the power supply voltage to the operational circuit and the auxiliary power supply interconnection is different from the main power supply interconnection, and a current control section that varies an amount of the bypass current supplied by the current bypass section to the main power supply interconnection in accordance with a predetermined current variation pattern, under an external control, during an operation of the operational circuit.

According to the second aspect related to the innovations herein, one exemplary electronic device may include an operational circuit and a power supply stabilizing circuit that is provided in the same chip as the operational circuit. The power supply stabilizing circuit stabilizes a power supply voltage supplied to the operational circuit. The power supply stabilizing circuit includes a current bypass section that supplies a bypass current from an auxiliary power supply interconnection to a main power supply interconnection, where the main power supply interconnection supplies the power supply voltage to the operational circuit and the auxiliary power supply interconnection is different from the main power supply interconnection, and a current control section that varies an amount of the bypass current supplied by the current bypass section to the main power supply interconnection in accordance with a predetermined current variation pattern, under an external control, during an operation of the operational circuit.

According to the third aspect related to the innovations herein, one exemplary test apparatus may test a device under test, and includes a signal input section that generates a predetermined test signal and supplies the generated predetermined test signal to the device under test, and a judging section that judges whether the device under test is acceptable with reference to a response signal that is output from the device under test in response to the test signal. The signal input section includes an operational circuit that operates to generate the test signal, and a power supply stabilizing circuit that is provided in the same chip as the operational circuit, where the power supply stabilizing circuit stabilizes a power supply voltage supplied to the operational circuit. The power supply stabilizing circuit includes a current bypass section that supplies a bypass current from an auxiliary power supply interconnection to a main power supply interconnection, where the main power supply interconnection supplies the power supply voltage to the operational circuit and the auxiliary power supply interconnection is different from the main power supply interconnection, and a current control section that varies an amount of the bypass current supplied by the current bypass section to the main power supply interconnection in accordance with a predetermined current variation pattern, under an external control, during an operation of the operational circuit.

The summary clause does not necessarily describe all necessary features of the embodiments of the present invention. The present invention may also be a sub-combination of the features described above. The above and other features and advantages of the present invention will become apparent from the following description of the embodiments taken in conjunction with the accompanying drawings.

BRIEF DESCRIPTION OF THE DRAWINGS

FIGS. 5A and 5B illustrate other examples of the current variation pattern designated to the current control section 38, where FIG. 5A illustrates a current variation pattern corresponding to sequence data S1 and FIG. 5B illustrates a current variation pattern corresponding to sequence data S2.

DESCRIPTION OF EXEMPLARY EMBODIMENTS

Some aspects of the invention will now be described based on the embodiments, which do not intend to limit the scope of the present invention, but exemplify the invention. All of the features and the combinations thereof described in the embodiment are not necessarily essential to the invention.

First Embodiment

Figure 1:
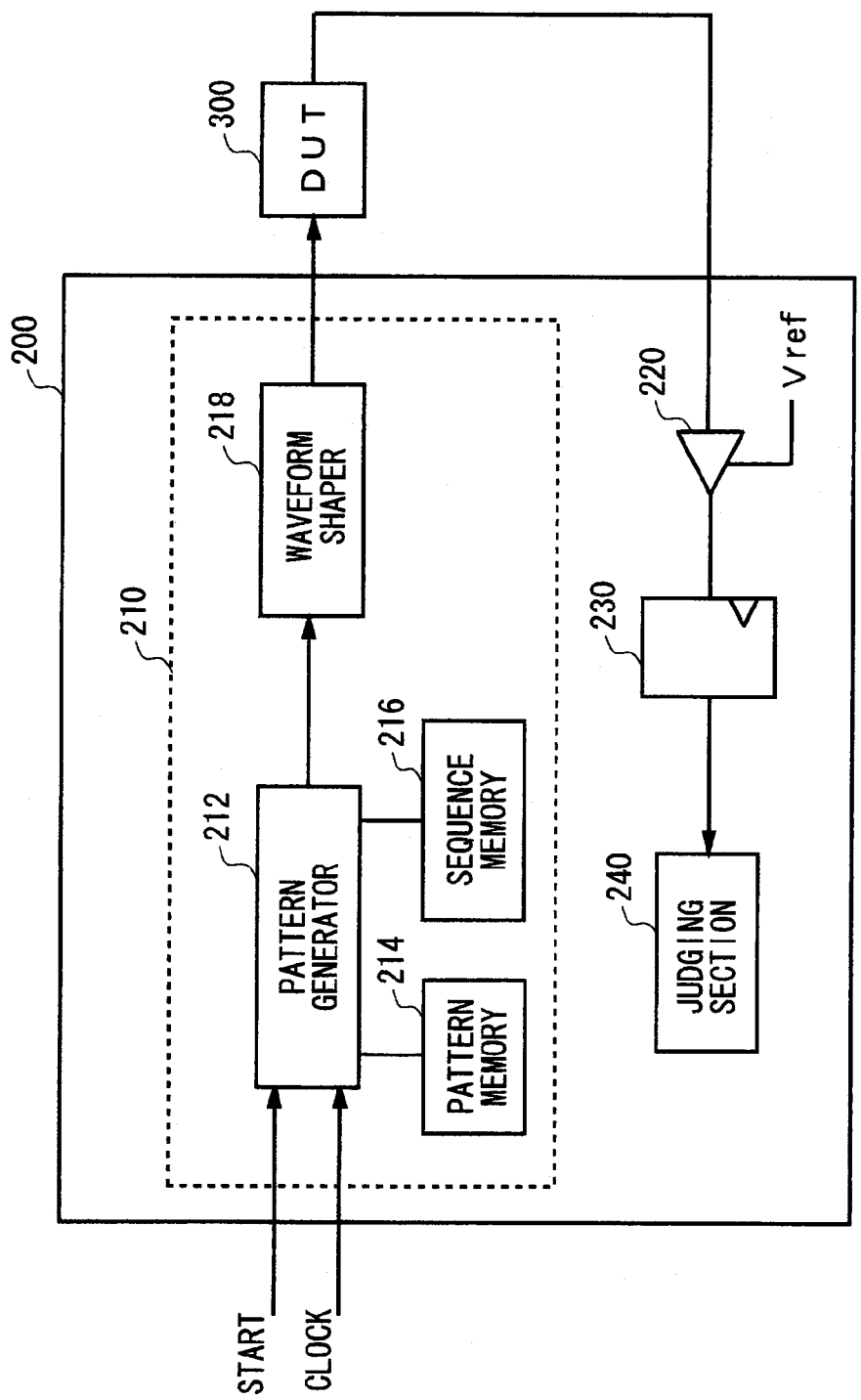
FIG. 1 illustrates an exemplary configuration of a test apparatus 200 relating to an embodiment of the present invention.

FIG. 1 illustrates an exemplary configuration of a test apparatus 200 relating to an embodiment of the present invention. The test apparatus 200 tests a device under test 300 such as a semiconductor circuit. The test apparatus 200 includes a signal input section 210, a level comparing section 220, a timing comparing section 230, and a judging section 240.

The signal input section 210 generates a predetermined test signal and supplies the generated test signal to the device under test 300. In one example, the signal input section 210 generates a test signal having a predetermined logic pattern, based on pattern data and sequence data supplied thereto in advance from a user or the like. More specifically, the signal input section 210 may generate the logic pattern of the test signal by reading the pattern data in accordance with the order defined by the sequence data.

The signal input section 210 may generate the predetermined test signal by using a different method. For example, the signal input section 210 may generate the logic pattern of the test signal by using a predetermined computation technique, a predetermined algorithm or the like. The signal input section 210 shown in FIG. 1 generates a test signal based on pattern data and sequence data, for example.

According to the present embodiment, the signal input section 210 includes a pattern generator 212, a pattern memory 214, a sequence memory 216, and a waveform shaper 218. The pattern memory 214 prestores pattern data supplied from, for example, an external controller that controls the test apparatus 200. In one example, the pattern memory 214 stores pattern data on each of its addresses.

The sequence memory 216 prestores sequence data supplied from the controller or the like. The sequence data may sequentially designate the addresses of the pattern memory 214, for example.

The pattern generator 212 generates an expected logic pattern of a test signal in accordance with an operation control signal supplied from the controller or the like. The operation control signal may include a START signal indicating the start timing of the generation of the logic pattern, a CLOCK signal defining the operation cycle time of the pattern generator 212, and the like. For example, the pattern generator 212 may start reading the sequence data from the sequence memory 216 in accordance with the rising edge of the START signal. The pattern generator 212 may generate the logic pattern of the test signal by sequentially reading the pattern data in accordance with the CLOCK signal, from the address sequentially designated by the sequence data.

The sequence memory 216 may store a plurality of types of sequence data. In this case, the pattern generator 212 may read sequence data designated by the operation control signal and generate the logic pattern in accordance with the read sequence data. By doing this, the pattern generator 212 can generate a plurality of types of logic patterns.

The waveform shaper 218 generates a test signal having the logic pattern generated by the pattern generator 212. In one example, the waveform shaper 218 generates a test signal that has a predetermined amplitude and a predetermined bit rate and that has a waveform corresponding to the logic pattern generated by the pattern generator 212. The waveform shaper 218 supplies the generated test signal to the device under test 300.

The device under test 300 operates in accordance with the supplied test signal, and outputs a response signal corresponding to the result of the operation. The level comparing section 220 receives the response signal from the device under test 300, and compares the signal level of the response signal with a predetermined reference level Vref. According to the present embodiment, the level comparing section 220 outputs the H logic during a period in which the signal level of the response signal is higher than the reference level Vref, and outputs the L logic during a period in which the signal level of the response signal is lower than or equal to the reference level Vref.

The timing comparing section 230 samples the logic value output from the level comparing section 220 in accordance with a strobe signal supplied thereto. In one example, the timing comparing section 230 can measure the logic pattern of the response signal by detecting the logic value of the response signal in each bit interval.

The judging section 240 judges whether the device under test 300 is acceptable by referring to the measurement of the response signal by the level comparing section 220 and the timing comparing section 230. For example, the judging section 240 may judge whether the device under test 300 is acceptable by determining whether the logic pattern of the response signal measured by the timing comparing section 230 is coincident with a predetermined expected value pattern. With the above-described configuration, the test apparatus 200 can test the device under test 300.

Figure 2:
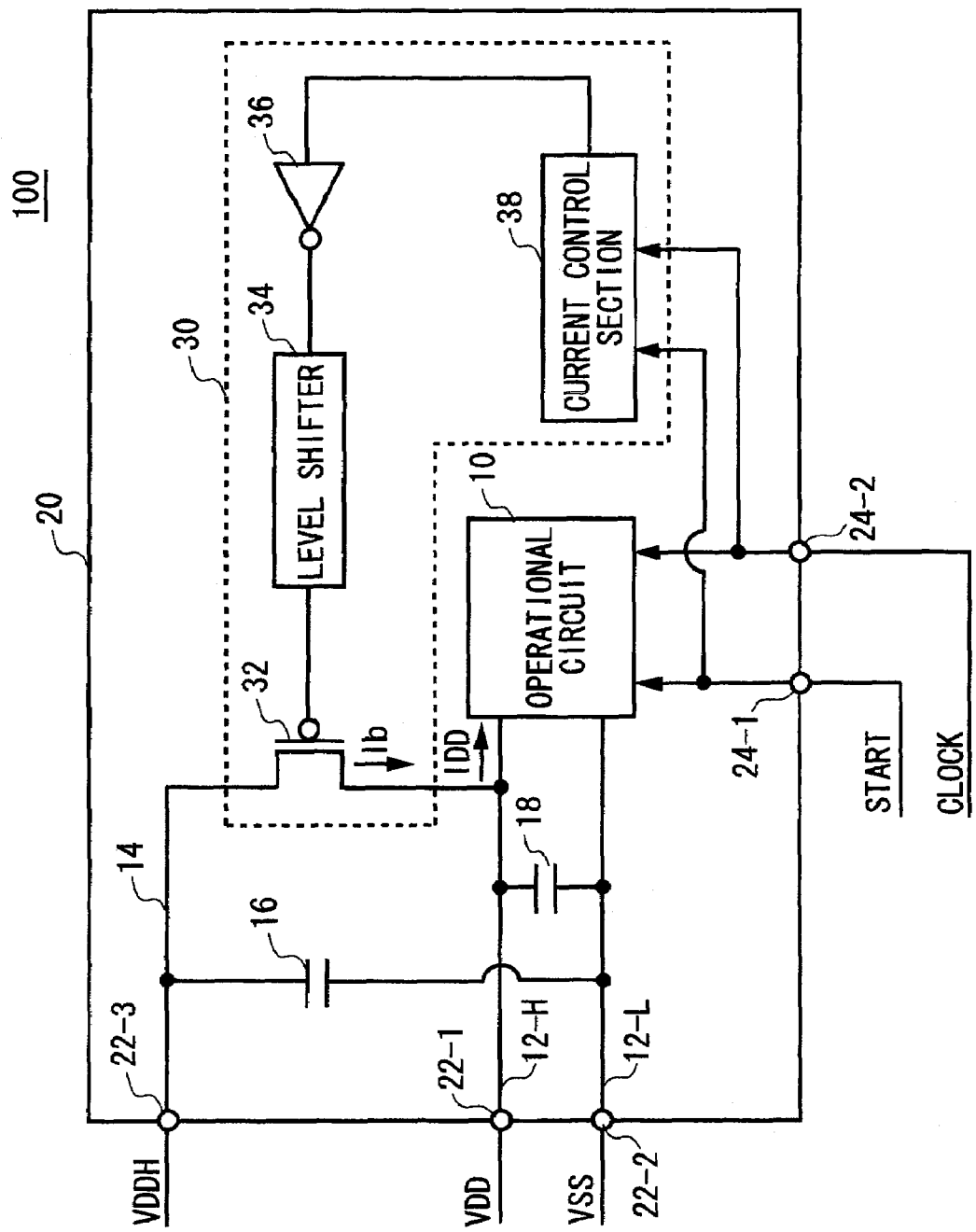
FIG. 2 illustrates an exemplary configuration of an electronic device 100 used in the test apparatus 200.

FIG. 2 illustrates an exemplary configuration of an electronic device 100 used in the test apparatus 200. For example, the electronic device 100 may function as the signal input section 210 described with reference to FIG. 1 or as a portion of the signal input section 210. According to the present example, the electronic device 100 functions as the pattern generator 212.

The electronic device 100 includes an operational circuit 10, a main power supply interconnection 12, an auxiliary power supply interconnection 14, an auxiliary bypass capacitor 16, a main bypass capacitor 18, a package 20, and a power supply stabilizing circuit 30. The package 20 houses the operational circuit 10, the main power supply interconnection 12, the auxiliary power supply interconnection 14, the auxiliary bypass capacitor 16, the main bypass capacitor 18, and the power supply stabilizing circuit 30.

For example, the package 20 may be formed so as to cover the semiconductor substrate on which the operational circuit 10 and other constituents are arranged, and may be made from resin, ceramic or the like. The package 20 has terminals formed on its front surface, which exchange power, signals and the like between the inside and the outside the chip of the electronic device 100. According to the present example, the package 20 has power supply terminals 22 (22-1 to 22-3) and signal terminals 24 (24-1 and 24-2) formed thereon.

The operational circuit 10 generates a predetermined logic pattern in accordance with an operation control signal (the START signal and the CLOCK signal) supplied via the signal terminals 24. Note that FIG. 2 does not show the interconnection and the like for transmitting the logic pattern from the operational circuit 10 to the waveform shaper 218.

The power supply terminals 22-1 and 22-2 receive power supply voltages VDD and VSS from outside. The main power supply interconnection 12 supplies the power supply voltages received at the power supply terminals 22-1 and 22-2, to the operational circuit 10.

In some cases, the consumption current IDD of the operational circuit 10 may vary depending on the condition under which the operational circuit 10 operates. Here, the main power supply interconnection 12 has a resistance component and the like. Therefore, the variation in the consumption current IDD of the operational circuit 10 alters the voltage drop in the main power supply interconnection 12, resulting in the variation in the power supply voltage supplied to the operational circuit 10 by the main power supply interconnection 12.

The power supply stabilizing circuit 30 is provided in the same chip as the operational circuit 10, and is configured to stabilize the power supply voltage supplied to the operational circuit 10. As explained earlier, the operational circuit 10 is designed to generate a predetermined logic pattern. Therefore, it is possible to estimate how the consumption current IDD of the operational circuit 10 varies. The power supply stabilizing circuit 30 reduces the variation in the power supply voltage supplied to the operational circuit 10 by supplying to the main power supply interconnection 12 a bypass current Ib determined in accordance with the variation in the consumption current IDD of the operational circuit 10.

Estimating how the consumption current IDD of the operational circuit 10 varies can be done by actually measuring the consumption current IDD of the operational circuit 10 when the operational circuit 10 generates a predetermined logic pattern. Alternatively, how the consumption current IDD varies may be estimated by using simulation or the like, based on the circuit structure of the operational circuit 10, the design information (such as constants) of the operational circuit 10, and the logic pattern expected to be generated by the operational circuit 10. Based on the pattern of the variation in the consumption current IDD, a user or the like sets in advance, at the power supply stabilizing circuit 30, the pattern of the variation in the bypass current Ib supplied to the main power supply interconnection 12.

According to the present example, the power supply stabilizing circuit 30 includes a current bypass section 32, a level shifter 34, an inverse amplifier 36, and a current control section 38. The current bypass section 32 is disposed between the main power supply interconnection 12 and the auxiliary power supply connection 14, and supplies the bypass current Ib from the auxiliary power supply interconnection 14 to the main power supply interconnection 12. The current bypass section 32 may be a transistor that supplies the bypass current Ib determined in accordance with the voltage supplied to its gate terminal, from the auxiliary power supply interconnection 14 to the high-voltage main interconnection 12-H. Here, the auxiliary power supply interconnection 14 receives an auxiliary power supply voltage VDDH from outside via the power supply terminal 22-3, which is different from the power supply terminals 22 used by the main power supply interconnection 12.

The current control section 38 varies the amount of the bypass current Ib supplied from the current bypass section 32 to the main power supply interconnection 12, under an external control, while the operational circuit 10 is operating. As mentioned above, the current control section 38 varies the amount of the bypass current Ib in accordance with a current variation pattern set in advance. According to the present example, the current control section 38 may start controlling the bypass current Ib in accordance with the current variation pattern, in response to the operation control signal (the START signal and the CLOCK signal) supplied to the operational circuit 10. According to the present example, the current control section 38 outputs a control voltage determined in accordance with the current variation pattern, in order to control the bypass current Ib. According to the exemplary configuration shown in FIG. 2, the current control section 38 is independently provided from the operational circuit 10. The current control section 38, however, may be included in the operational circuit 10.

The inverse amplifier 36 amplifies the control voltage output from the current control section 38 with a predetermined amplification ratio, and outputs the inverse of the amplified control voltage. The level shifter 34 shifts the control voltage output from the inverse amplifier 36. In one example, the level shifter 34 shifts the bias level of the control voltage (Vgs) so that the control voltage varies within such a range that the current bypass section 32 has a linear Ids-Vgs characteristic. With the above-described configuration, the power supply stabilizing circuit 30 can supply to the main power supply interconnection 12 the bypass current Ib in accordance with the variation in the consumption current IDD of the operational circuit 10. As a result, the power supply stabilizing circuit 30 can reduce the variation in the voltage drop in the main power supply interconnection 12, thereby reducing the variation in the power supply voltage supplied to the operational circuit 10.

The main bypass capacitor 18 is provided between the main power supply interconnection 12 and a predetermined potential. According to the present example, the main bypass capacitor 18 is provided between the high-voltage main interconnection 12-H and the low-voltage main interconnection 12-L.

The main bypass capacitor 18 supplies, to the main power supply interconnection 12, the current determined in accordance with the variation in the power supply voltage in the main power supply interconnection 12. The main bypass capacitor 18 preferably follows the variation in the power supply voltage more quickly than the power supply stabilizing circuit 30. Being constituted by transistors and the like, the power supply stabilizing circuit 30 follows the variation in the power supply voltage with a certain delay. During such a delay, the main bypass capacitor 18 compensates for the variation in the power supply voltage.

The auxiliary bypass capacitor 16 is provided between the auxiliary power supply interconnection 14 and a predetermined potential. According to the present example, the auxiliary bypass capacitor 16 is provided between the auxiliary power supply interconnection 14 and the low-voltage power supply interconnection 12-L. The auxiliary bypass capacitor 16 reduces a sudden and steep voltage change in the auxiliary power supply interconnection 14.

Figure 3:
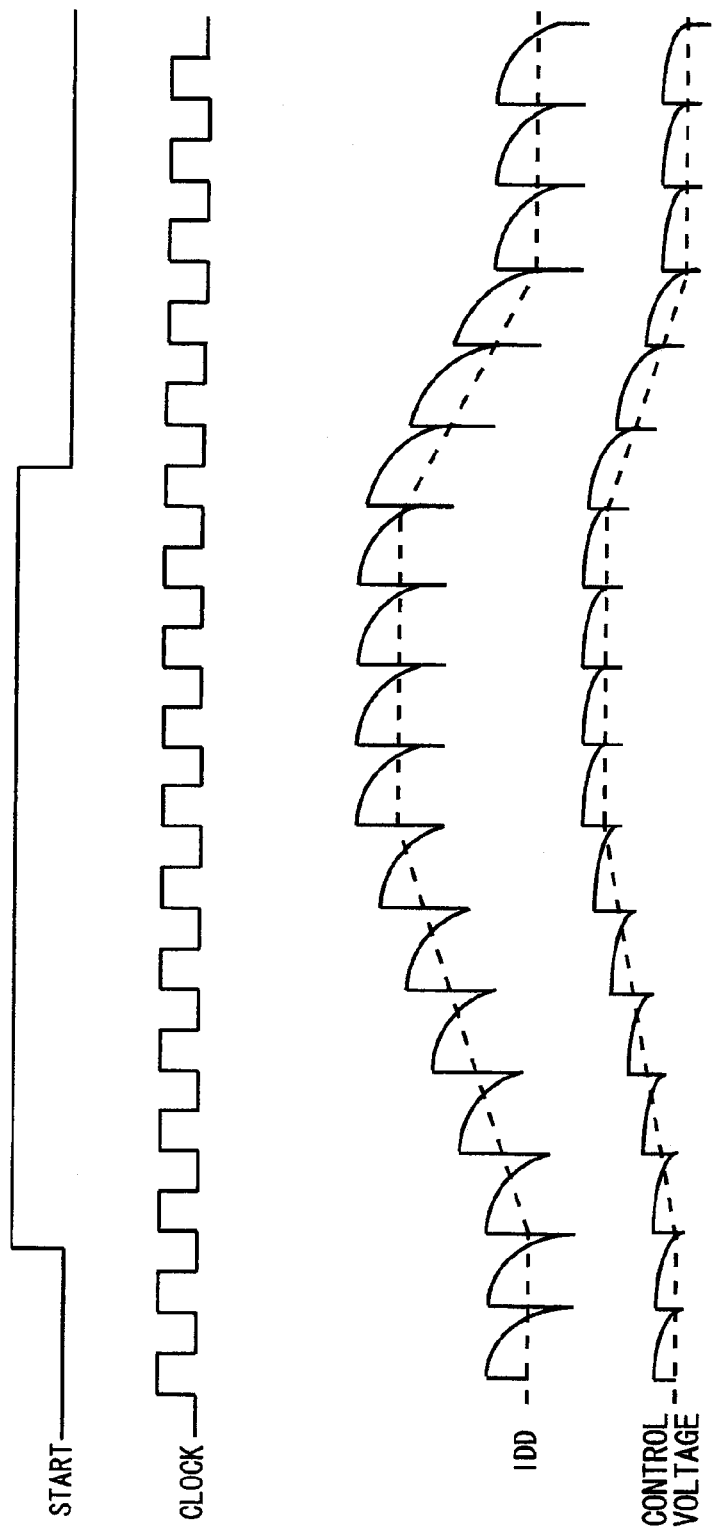
FIG. 3 illustrates an exemplary operation of a power supply stabilizing circuit 30.

FIG. 3 illustrates an exemplary operation of the power supply stabilizing circuit 30. FIG. 3 shows exemplary waveforms of the START signal, the CLOCK signal, the consumption current IDD of the operational circuit 10 and the control voltage output from the current control section 38.

The operational circuit 10 starts operating in accordance with the rising edge of the START signal. As an alternative example, the operational circuit 10 may start operating in accordance with the initial pulse of the CLOCK signal. The operational circuit 10 stops operating in accordance with the falling edge of the START signal. As an alternative example, the operational circuit 10 may stop operating when no longer receiving the pulses of the CLOCK signal.

As the operational circuit 10 operates, the consumption current IDD of the operational circuit 10 varies. According to the present example, the consumption current IDD of the operational circuit 10 gradually increases after the start of the operation of the operational circuit 10, as shown by the solid-line waveform in FIG. 3. When a predetermined time has elapsed since the start of the operation of the operational circuit 10, the consumption current IDD of the operational circuit 10 becomes stable. After the operational circuit 10 stops operating, the consumption current IDD decreases to substantially zero.

The current control section 38 receives in advance designation of a current variation pattern determined in accordance with the variation pattern of the consumption current IDD. For example, the current control section 38 may receive designation of a current variation pattern that is obtained by approximating with a straight line the estimated or measured variation pattern of the consumption current IDD. The current control section 38 outputs a control voltage determined in accordance with the designated current variation pattern. For example, the current control section 38 may output a control voltage that causes the current bypass section 32 to generate a bypass current Ib substantially the same as the varied component of the consumption current IDD. The current control section 38 may output, as the control voltage, a voltage that is defined by the current variation pattern of the bypass current Ib to be generated, the characteristics of the current bypass section 32, and the amplification ratio of the inverse amplifier 36.

Figure 4:
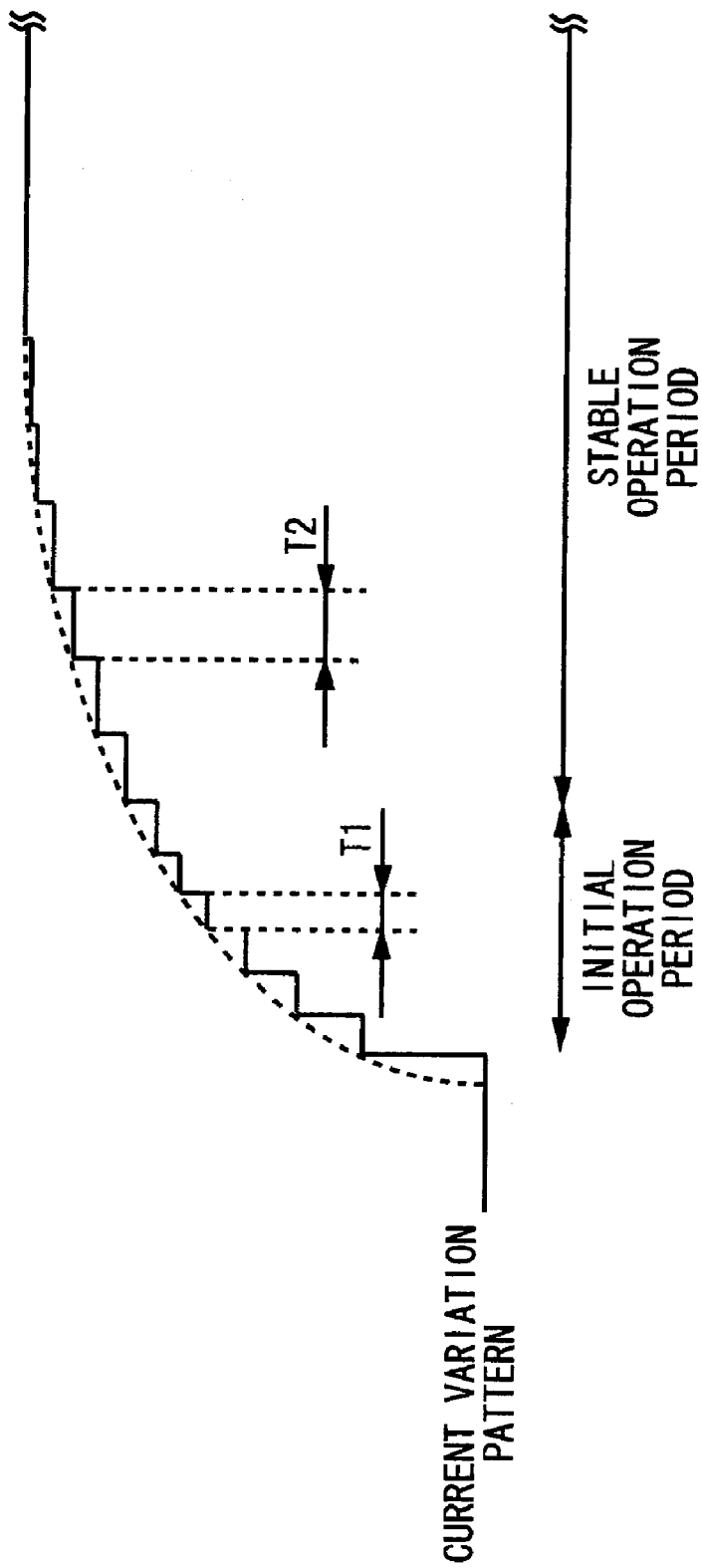
FIG. 4 illustrates an example of the current variation pattern designated to a current control section 38.

FIG. 4 illustrates an example of the current variation pattern designated to the current control section 38. The current control section 38 may receive designation of a current variation pattern the value of which varies at predetermined time intervals as shown in FIG. 4. Here, the current variation pattern designated to the current control section 38 may be configured in such a manner that a time interval T1, at which the current value varies, until a predetermined initial operation period has elapsed since the start of the bypass current control is shorter than a time interval T2, at which the current value varies, after the initial operation period has elapsed. By controlling the bypass current Ib using such a current variation pattern, the current control section 38 can compensate for the variation in the power supply voltage more quickly during the initial operation period in which the consumption current IDD varies more significantly.

FIGS. 5A and 5B illustrate other examples of the current variation pattern designated to the current control section 38. According to the present embodiment, the operational circuit 10 performs a predetermined operation associated with the type of an operation control signal supplied thereto and generates a logic pattern in accordance with the type of the operation control signal. The current control section 38 prestores a plurality of types of current variation patterns in association with a plurality of types of operation control signals.

Here, the type of the operation control signal may designate one of the pieces of sequence data stored on the sequence memory 216, for example. The operation control signal may be supplied to the operational circuit 10, separately from the above-mentioned START signal and the CLOCK signal. The current control section 38 selects a current variation pattern in accordance with the type of the operation control signal supplied to the operational circuit 10 and controls the bypass current Ib using the selected current variation pattern.

FIGS. 5A and 5B illustrate the examples of the plurality of types of current variation patterns prestored on the current control section 38. FIG. 5A illustrates a current variation pattern associated with sequence data S1. FIG. 5B illustrates a current variation pattern associated with sequence data S2. According to the present embodiment, the START signal designates which sequence data is to be selected.

As seen from FIGS. 5A and 5B, when the operational circuit 10 operates in accordance with different sequence data, the consumption current of the operational circuit 10 may have a different variation pattern. Therefore, the current control section 38 identifies sequence data in accordance with which the operational circuit 10 operates, with reference to the operation control signal (the START signal). The current control section 38 uses the current variation pattern associated with the identified sequence data in order to control the bypass current Ib. As a result, the power supply stabilizing circuit 30 can more accurately reduce the variation in the power supply voltage supplied to the operational circuit 10.

The current control section 38 may control the bypass current by using an appropriate one of different current variation patterns associated with different temperature levels of the operational circuit 10. The electronic device 100 may further include a sensor for detecting the temperature of the operational circuit 10. The current control section 38 may control the bypass current by using an appropriate one of different current variation patterns associated with different uninterrupted operating time periods of the operational circuit. The electronic device 100 may further include a measuring section for measuring the uninterrupted operating time period of the operational circuit.

Second Embodiment

Figure 6:
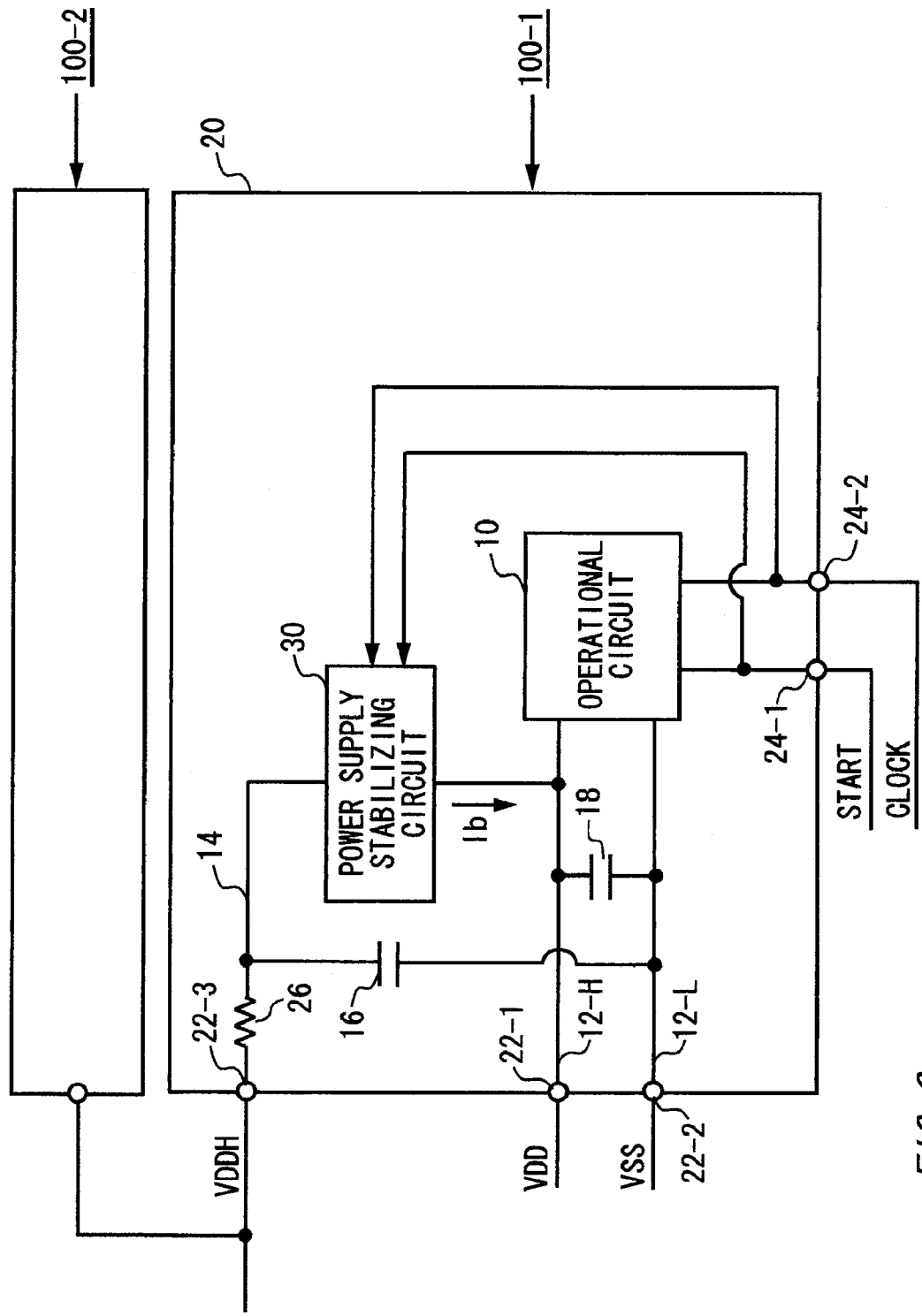
FIG. 6 illustrates another exemplary configuration of the electronic device 100-1.

FIG. 6 illustrates another exemplary configuration of the electronic device 100-1. The electronic device 100-1 relating to the present embodiment receives an auxiliary power supply voltage VDDH from a power supply system shared by a different electronic device 100-2.

The electronic device 100-1 relating to the present embodiment includes a current reducing resistance 26, in addition to the constituents of the electronic device 100 shown in FIG. 2. Other than the current reducing resistance 26, the electronic device 100-1 may have the same constituents as the electronic device 100 shown in FIG. 2.

The current reducing resistance 26 is provided in the auxiliary power supply interconnection 14, and functions as a current reducing section that reduces the current flowing through the auxiliary power supply interconnection 14. The existence of the current reducing resistance 26 suppresses the charging current of the auxiliary bypass capacitor 16. This can in turn reduce a sudden and steep change in the auxiliary power supply voltage VDDH at the power supply terminal 22-3. As a result, the electronic device 100-1 can reduce the change in the auxiliary power supply voltage VDDH supplied to the different electronic device 100-2. The current reducing resistance 26 may have a resistance value of approximately several dozen Ω to several hundred Ω, for example, and the auxiliary bypass capacitor may have a capacitance of approximately several pF to several dozen pF.

Third Embodiment

Figure 7:
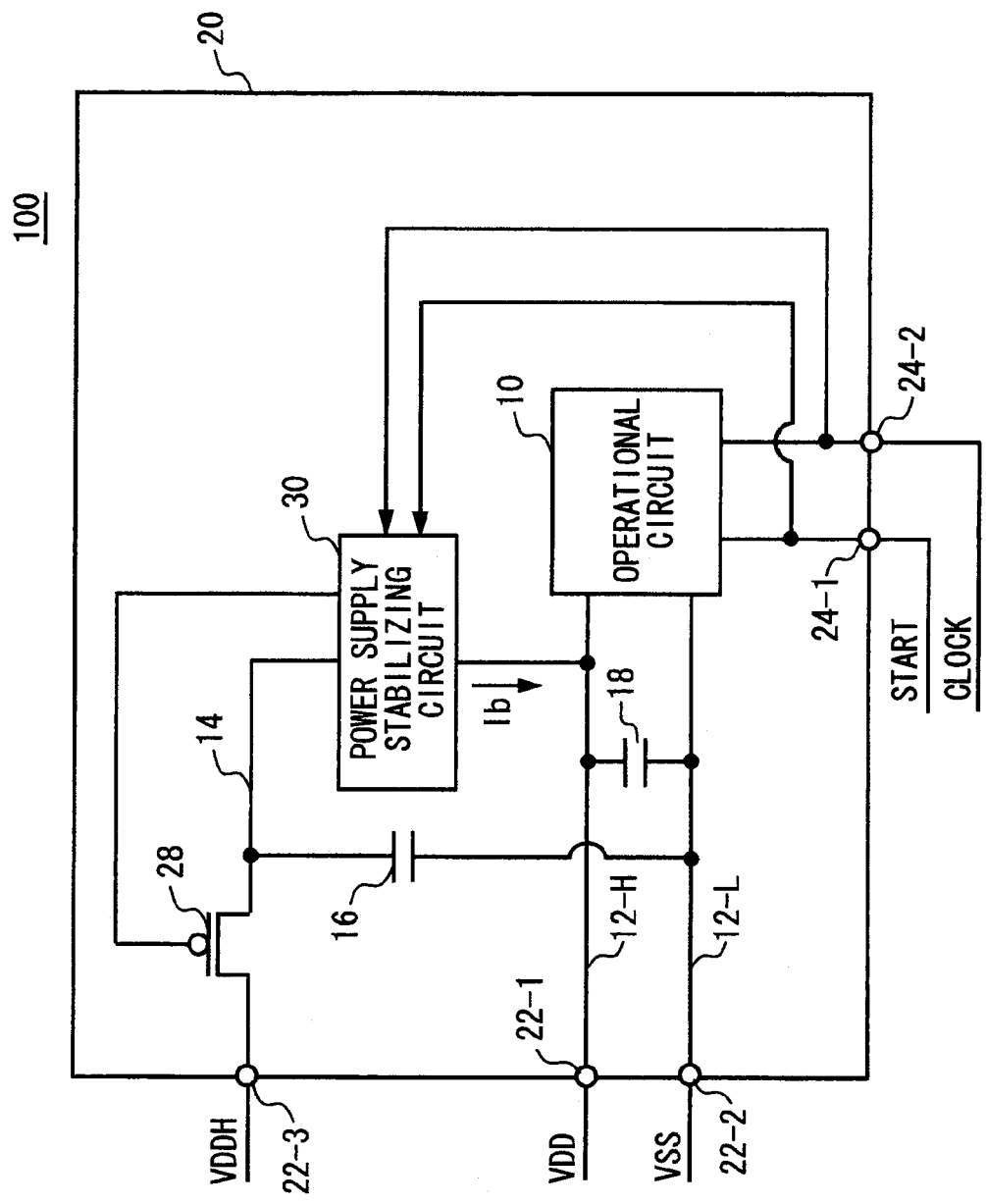
FIG. 7 illustrates another exemplary configuration of the electronic device 100-1.

FIG. 7 illustrates another exemplary configuration of the electronic device 100. Similarly to the electronic device 100-1 shown in FIG. 6, the electronic device 100 relating to the present embodiment receives the auxiliary power supply voltage VDDH from the power supply system shared by the different electronic device 100-2.

The electronic device 100 relating to the present embodiment has the same configuration as the electronic device 100-1 shown in FIG. 6 except for a current reducing transistor 28, which is provided in place of the current reducing resistance 26. Other than the current reducing transistor 28, the electronic device 100 relating to the present embodiment may have the same constituents as the electronic device 100-1 shown in FIG. 6.

The current reducing transistor 28 is provided in the auxiliary power supply interconnection 14, and functions as the current reducing section that reduces the current flowing through the auxiliary power supply interconnection 14. The power supply stabilizing circuit 30 may reduce the current flowing through the auxiliary power supply interconnection 14 by controlling the gate voltage of the current reducing transistor 28. For example, the power supply stabilizing circuit 30 may linearly control the current flowing through the auxiliary power supply interconnection 14, by controlling the current reducing transistor 28 to operate in the linear region.

The power supply stabilizing circuit 30 may reduce the current flowing through the auxiliary power supply interconnection 14, by controlling the duty factor representing the ratio between the ON-time and OFF-time of the current reducing transistor 28. For example, the power supply stabilizing circuit 30 may control the current flowing through the auxiliary power supply interconnection 14, by controlling the density and the pulse width of the pulse voltage that turns on the current reducing transistor 28.

With the above-described configuration, the electronic device 100 relating to the present embodiment reduces the charging current of the auxiliary bypass capacitor 16, thereby reducing a sudden and steep change in the auxiliary power supply voltage VDDH at the power supply terminal 22-3. As a result, the electronic device 100 relating to the present embodiment can reduce the change in the auxiliary power supply voltage VDDH supplied to the different electronic device 100-2.

Fourth Embodiment

Figure 8:
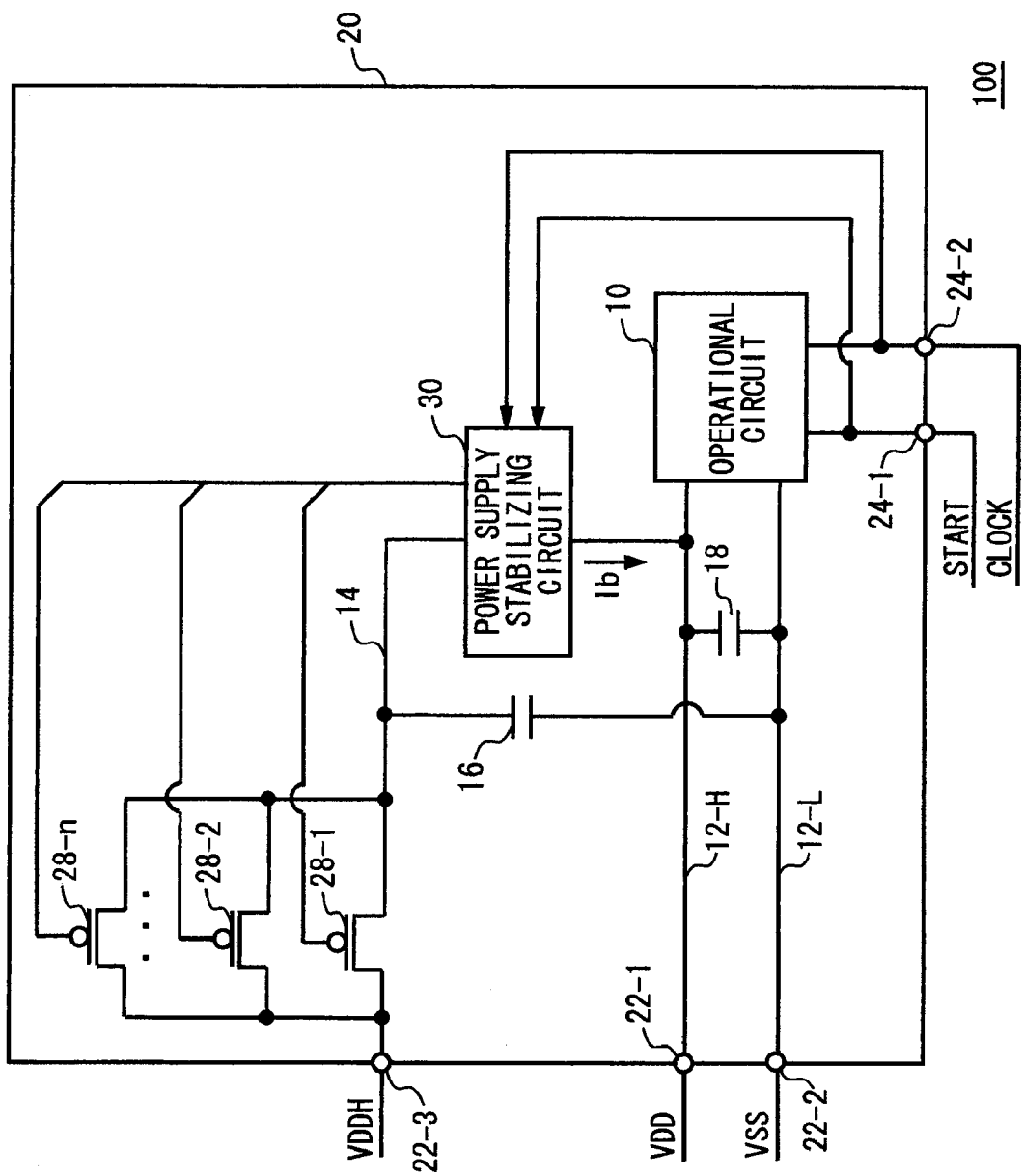
FIG. 8 illustrates another exemplary configuration of the electronic device 100-1.

FIG. 8 illustrates another exemplary configuration of the electronic device 100. Similarly to the electronic device 100-1 shown in FIG. 6, the electronic device 100 relating to the present embodiment also receives the auxiliary power supply voltage VDDH from the power supply system shared by the different electronic device 100-2.

The electronic device 100 relating to the present embodiment has the same configuration as the electronic device 100 shown in FIG. 7 except for that a plurality of current reducing transistors 28 are provided in parallel. Other than the current reducing transistors 28 provided in parallel, the electronic device 100 relating to the present embodiment may have the same constituents as the electronic device 100 shown in FIG. 7.

The current reducing transistors 28 are provided in parallel with each other between the power supply terminal 22-3 and the power supply stabilizing circuit 30. The power supply stabilizing circuit 30 controls the current flowing through the auxiliary power supply interconnection 14, by controlling the number of current reducing transistors 28 in the ON-state. When the current reducing transistors 28 are turned on, substantially the same current may flow through each current reducing transistor 28, or the current flowing through each current reducing transistor 28 may be appropriately weighted.

Fifth Embodiment

Figure 9:
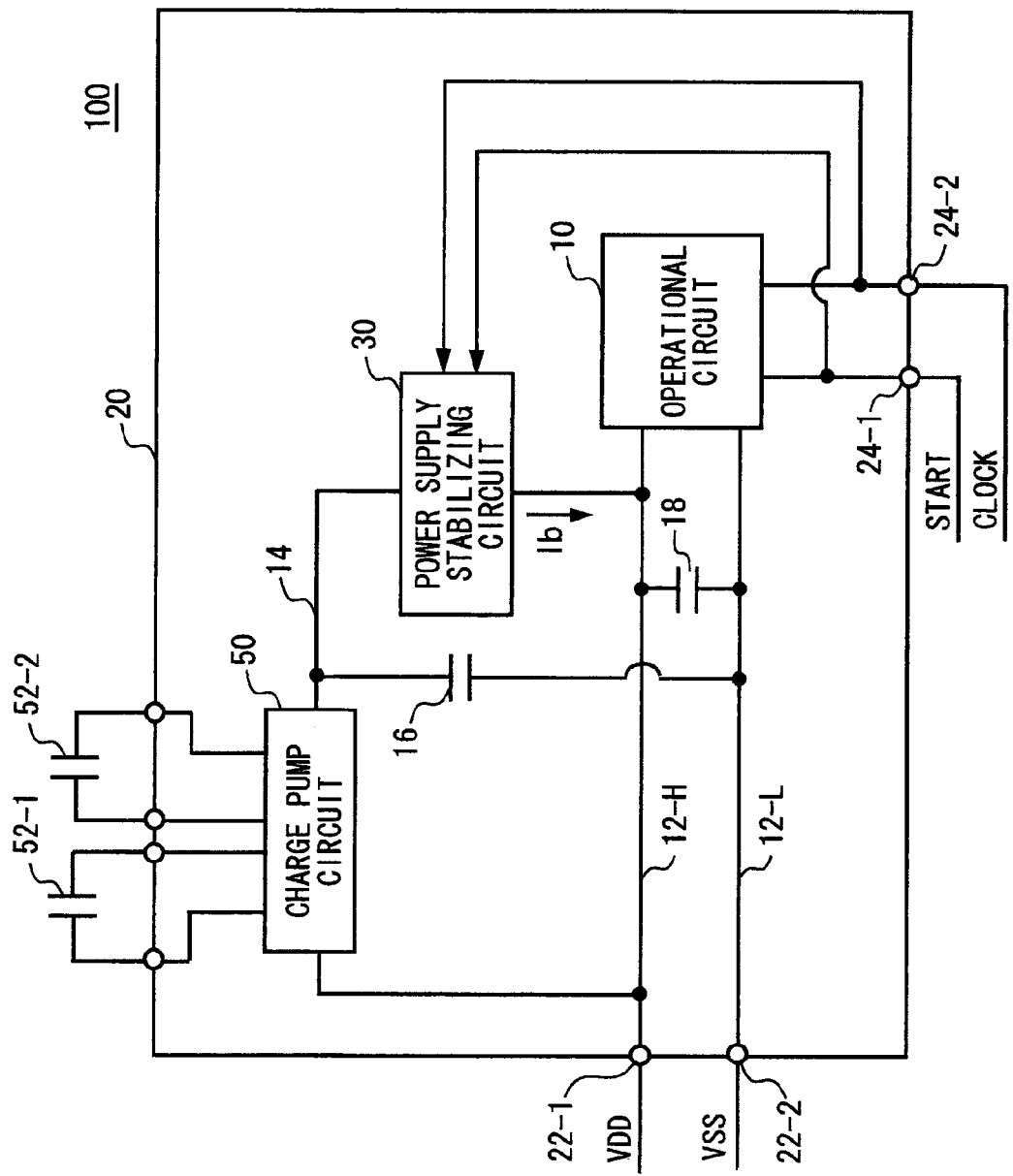
FIG. 9 illustrates another exemplary configuration of the electronic device 100-1.

FIG. 9 illustrates another exemplary configuration of the electronic device 100. The electronic device 100 relating to the present embodiment includes a charge pump circuit 50 and a plurality of charge pump capacitors 52 in addition to the constituents of the electronic device 100 shown in FIG. 2, and generates the auxiliary power supply voltage VDDH on its own. According to the present embodiment, the electronic device 100 may not include the power supply terminal 22-3.

The charge pump circuit 50 charges the charge pump capacitors 52, by using the voltage of the main power supply interconnection 12. In this case, the charge pump circuit 50 connects the charge pump capacitors 52 in parallel with each other. After charging the charge pump capacitors 52, the charge pump circuit 50 connects the charge pump capacitors 52 in series with each other. With the above-described configuration, the electronic device 100 relating to the present embodiment can generate the auxiliary power supply voltage VDDH, which is higher than the power supply voltage VDD or the like.

The charge pump circuit 50 may be provided inside the package 20, and the charge pump capacitors 52 may be provided outside the package 20. With such a configuration, the electronic device 100 relating to the present embodiment can use charge pump capacitors 52 having a larger capacitance.

Sixth Embodiment

Figure 10:
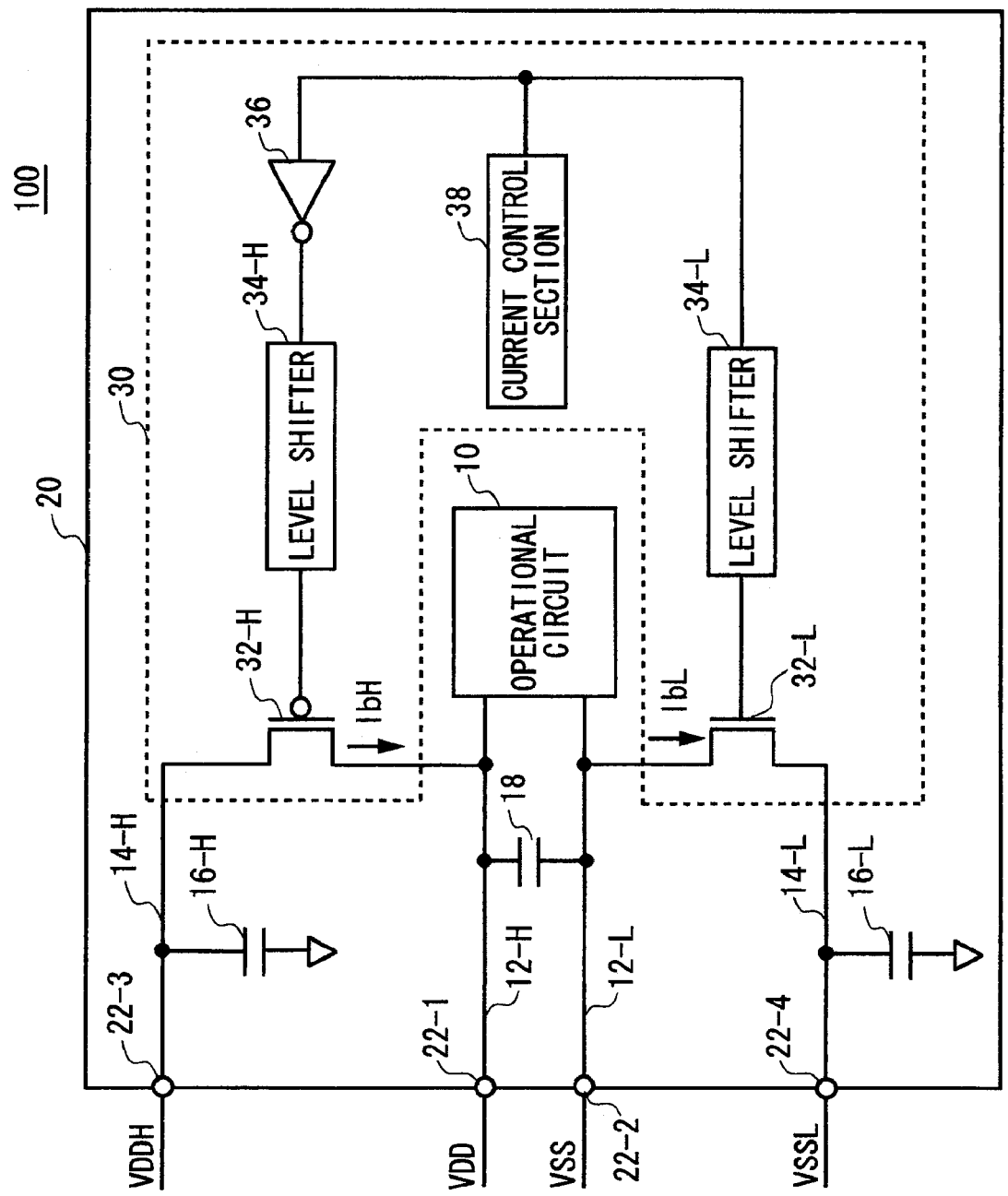
FIG. 10 illustrates another exemplary configuration of the electronic device 100-1.

FIG. 10 illustrates another exemplary configuration of the electronic device 100. According to the present embodiment, the electronic device 100 includes an operational circuit 10, a main power supply interconnection 12 (a high-voltage main interconnection 12-H and a low-voltage main interconnection 12-L), an auxiliary power supply interconnection 14 (a high-voltage auxiliary interconnection 14-H and a low-voltage auxiliary interconnection 14-L), an auxiliary bypass capacitor 16 (a high-voltage auxiliary capacitor 16-H and a low-voltage auxiliary capacitor 16-L), a main bypass capacitor 18, a package 20, and a power supply stabilizing circuit 30.

The operational circuit 10 may be the same as the operational circuit 10 illustrated with reference to FIG. 2. The main power supply interconnection 12 and the main bypass capacitor 18 may be respectively the same as the main power supply interconnection 12 and the main bypass capacitor 18 illustrated with reference to FIG. 2. Each of the high-voltage auxiliary capacitor 16-H and the low-voltage auxiliary capacitor 16-L is provided between the ground potential and a corresponding one of the high-voltage auxiliary interconnection 14-H and the low-voltage auxiliary interconnection 14-L.

The power supply stabilizing circuit 30 supplies bypass currents (a high-voltage bypass current IbH and a low-voltage bypass current IbL), designed to compensate for the variation in the power supply voltage, to the high-voltage main interconnection 12-H and the low-voltage main interconnection 12-L. The power supply stabilizing circuit 30 includes a current control section 38, an inverse amplifier 36, a high-voltage level shifter 34-H, a low-voltage level shifter 34-L, a high-voltage bypass section 32-H, and a low-voltage bypass section 32-L.

The high-voltage bypass section 32-H supplies the high-voltage bypass current IbH from the high-voltage auxiliary interconnection 14-H to the high-voltage main interconnection 12-H. The high-voltage auxiliary interconnection 14-H receives the high-voltage auxiliary power supply voltage VDDH via the power supply terminal 22-3.

The low-voltage bypass section 32-L pulls the low-voltage bypass current IbL from the low-voltage main interconnection 12-L to the low-voltage auxiliary interconnection 14-L. The low-voltage auxiliary interconnection 14-L receives the low-voltage auxiliary power supply voltage VSSL via the power supply terminal 22-4. The high-voltage bypass section 32-H may be implemented by a transistor similar to the transistor implementing the current bypass section 32 described with reference to FIG. 2. The low-voltage bypass section 32-L is preferably implemented by a transistor having an opposite polarity to the transistor implementing the high-voltage bypass section 32-H. Here, a pair of transistors having opposite polarities may denote a pair of transistors complementary to each other, for example, a pair of an NMOS transistor and a PMOS transistor or a pair of NPN transistor and a PNP transistor.

The current control section 38 controls the bypass currents generated at the high-voltage bypass section 32-H and the low-voltage bypass section 32-L. The current control section 38 may control the high-voltage bypass section 32-H by using a current variation pattern obtained by inversing the polarity of the current variation pattern used to control the low-voltage bypass section 32-L. According to the present embodiment, the current control section 38 outputs the same control voltage to the high-voltage bypass section 32-H and the low-voltage bypass section 32-L. The inverse amplifier 36 inverses the control voltage to be supplied to the high-voltage bypass section 32-H.

The high-voltage level shifter 34-H and the low-voltage level shifter 34-L respectively shift the bias levels of the control voltages supplied to the high-voltage bypass section 32-H and the low-voltage bypass section 32-L. More specifically, the high-voltage level shifter 34-H and the low-voltage level shifter 34-L respectively shift the bias levels of the control voltages so that the control voltages vary within such a range that the respective transistors have a linear Ids-Vgs characteristic.

With the above-described configuration, the electronic device 100 relating to the present embodiment can reduce the variation in the high-voltage power supply voltage and the low-voltage power supply voltage supplied to the operational circuit 10. The auxiliary power supply voltage VDDH may be set higher than the power supply voltage VDD by approximately 1V, and the auxiliary power supply voltage VDDL may be set lower than the power supply voltage VSS by approximately 1V. The configuration of the electronic device relating to the present embodiment, the configurations including the current reducing section, described with reference to FIGS. 6 to 8, and the configuration including the charge pump circuit 50 and the like, described with reference to FIG. 9 may be combined freely.

Seventh Embodiment

Figure 11:
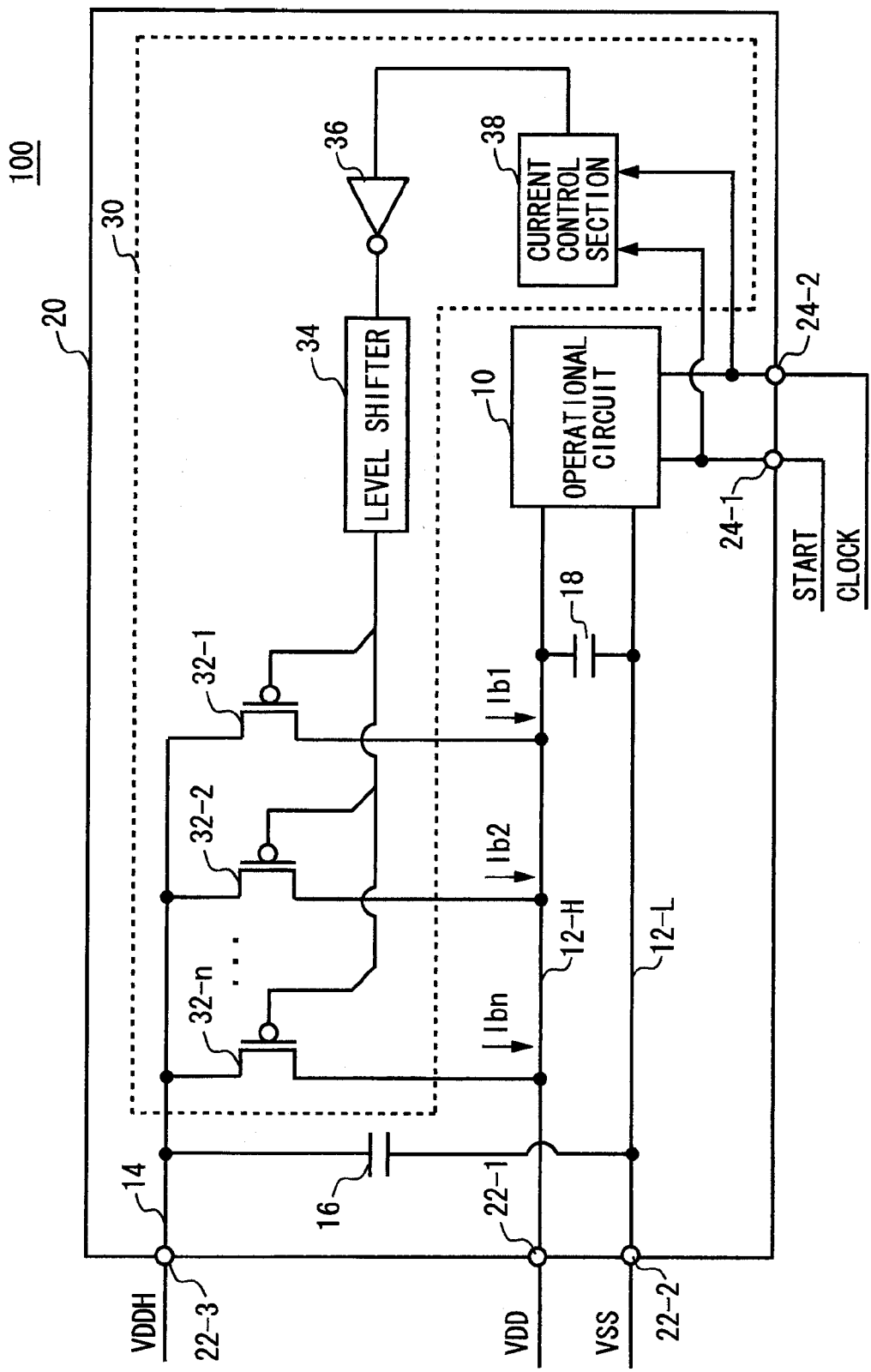
FIG. 11 illustrates another exemplary configuration of the electronic device 100-1.

FIG. 11 illustrates another exemplary configuration of the electronic device 100. According to the present embodiment, the electronic device 100 includes a plurality of current bypass sections 32 provided in parallel with each other. Other than the current bypass sections 32 provided in parallel with each other, the electronic device 100 relating to the present embodiment may have the same constituents as one of the electronic devices 100 described with reference to FIGS. 2 to 10.

The current bypass sections 32 are provided in parallel with each other, so as to be positioned between the auxiliary power supply interconnection 14 and the main power supply interconnection 12. Each current bypass section 32 may be a transistor. The current control section 38 controls the bypass current Ib by controlling the number of current bypass sections 32 in the ON-state.

When the current bypass sections 32 are turned on, substantially the same current may flow through each current bypass section 32, or the current flowing through each current bypass section 32 may be appropriately weighted. The current control section 38 may output digital data that turns on or off the current bypass sections 32.

Eighth Embodiment

Figure 12:
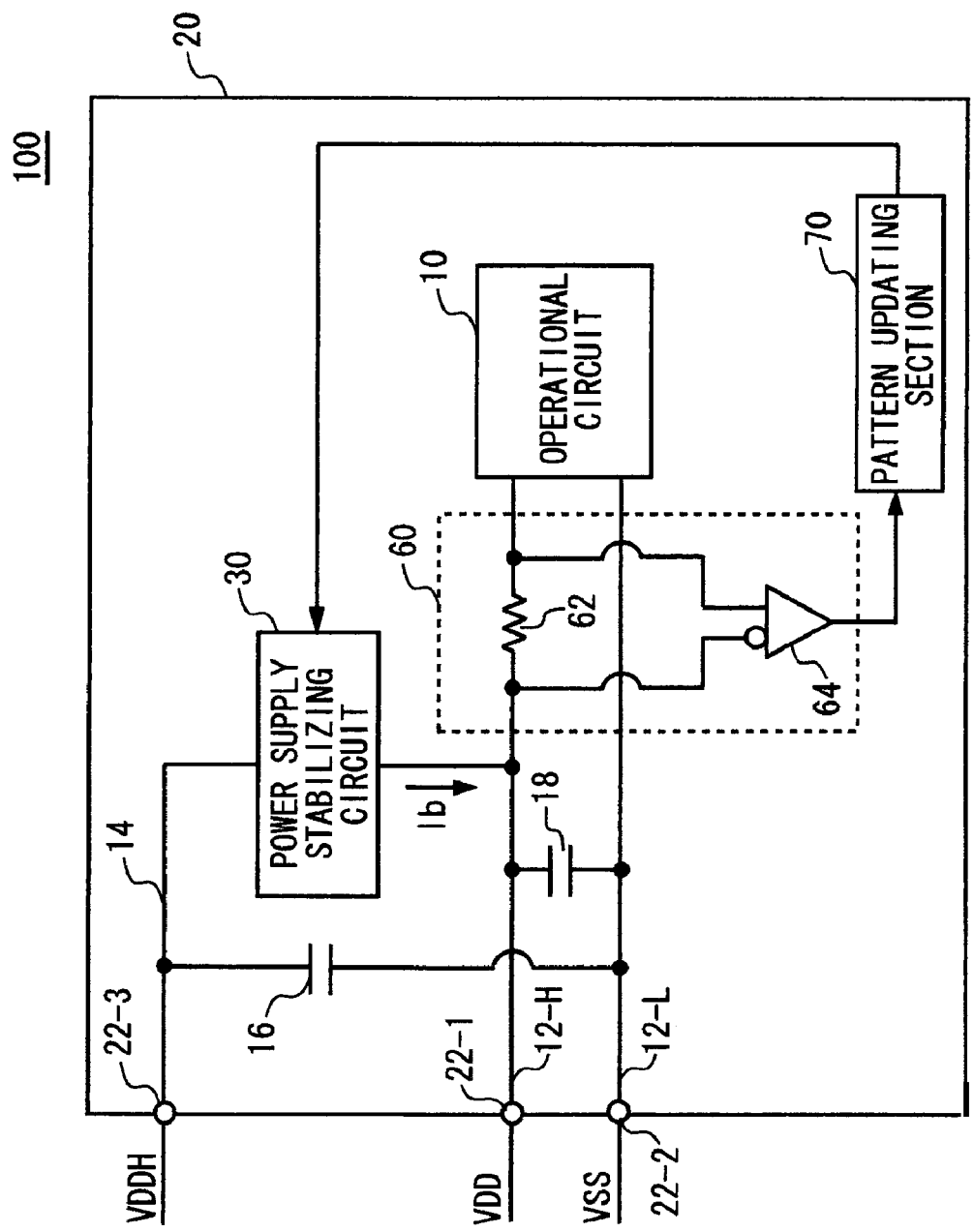
FIG. 12 illustrates another exemplary configuration of the electronic device 100-1.

FIG. 12 illustrates another exemplary configuration of the electronic device 100. According to the present embodiment, the electronic device 100 includes a current measuring section 60 and a pattern updating section 70, in addition to the constituents of one of the electronic devices 100 described with reference to FIGS. 2 to 11. Other than the current measuring section 60 and the pattern updating section 70, the electronic device 100 relating to the present embodiment may have the same configuration as one of the electronic devices 100 described with reference to FIGS. 2 to 11.

The current measuring section 60 measures the change in the consumption current IDD during the actual operation of the operational circuit 10. According to the present embodiment, the current measuring section 60 includes a current detecting resistance 62 and a differential circuit 64. The current detecting resistance 62 is provided in the main power supply interconnection 12 so as to be positioned in the vicinity of the operational circuit 10. The current detecting resistance 62 may be provided between the operational circuit 10 and the connection point between the power supply stabilizing circuit 30 and the main power supply interconnection 12. The differential circuit 64 detects, as the consumption current IDD, the potential difference between the respective ends of the current detecting resistance 62.

The pattern updating section 70 updates the current variation pattern stored on the current control section 38 with reference to the consumption current IDD measured by the current measuring section 60. For example, the current measuring section 60 may measure the variation pattern of the consumption current during the actual operation of the operational circuit 10, while the current bypass section 32 is suspended from operating and the bypass current Ib is set at substantially zero. The pattern updating section 70 may store, onto the current control section 38, the variation pattern measured by the current measuring section 60 as a new current variation pattern.

Alternatively, the current measuring section 60 may measure the variation pattern of the consumption current during the actual operation of the operational circuit 10, while the current bypass section 32 is kept operating. In this case, the pattern updating section 70 may adjust the current variation pattern stored on the current control section 38 so that the variation pattern measured by the current measuring section 60 becomes substantially zero.

The current measuring section 60 may measure the consumption current of the operational circuit 10 in association with each type of operation control signal. The pattern updating section 70 may use the consumption current IDD measured by the current measuring section 60 for each type of the operation control signal to update the corresponding current variation pattern.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alternations or improvements can be included in the technical scope of the invention.

For example, FIGS. 1 to 12 illustrate the electronic device 100 for use in the test apparatus 200. The use of the electronic device 100, however, is not limited to the test apparatus 200. The electronic device 100 can be used for a variety of devices provided that the devices are capable of estimating the variation pattern of the consumption current.

According to the above description, the START signal and the CLOCK signal are given as the examples of the operation control signal, but different signals may be used as the operation control signal. For example, the address signal supplied to the operational circuit 10, the data signal or the like may be used as the operation control signal.

As is apparent from the above description, the embodiments of the present invention can realize the power supply stabilizing circuit 30 and the electronic device 100 which are capable of accurately compensating for the variation in the power supply voltage, caused by the variation in the consumption current of the operational circuit 10, in the power supply interconnection within the electronic device 100. In addition, the embodiments of the present invention can realize the test apparatus 200 which is capable of accurately testing the device under test 300. The test apparatus 200 can generate the test signal with the variation in the power supply voltage of the operational circuit 10 being compensated for.

Although some aspects of the present invention have been described by way of exemplary embodiments, it should be understood that those skilled in the art might make many changes and substitutions without departing from the spirit and the scope of the present invention which is defined only by the appended claims.

What is claimed is:

1. A power supply stabilizing circuit provided in a chip of an electronic device, the power supply stabilizing circuit stabilizing a power supply voltage supplied to an operational circuit of the electronic device, comprising:
    a current bypass section that supplies a bypass current from an auxiliary power supply interconnection to a main power supply interconnection, the main power supply interconnection supplying the power supply voltage to the operational circuit, the auxiliary power supply interconnection being different from the main power supply interconnection; and
    a current control section that varies an amount of the bypass current supplied by the current bypass section to the main power supply interconnection in accordance with a predetermined current variation pattern, under an external control, during an operation of the operational circuit.

2. The power supply stabilizing circuit as set forth in claim 1, wherein
    the current control section starts controlling the bypass current in accordance with the current variation pattern, in response to an operation control signal supplied to the operational circuit.

3. The power supply stabilizing circuit as set forth in claim 2, wherein
    the operational circuit performs a predetermined operation associated with a type of the operation control signal supplied thereto, and
    the current control section prestores thereon a plurality of types of current variation patterns in association with a plurality of types of operation control signals, selects an appropriate one of the plurality of types of current variation patterns in accordance with the type of the operation control signal supplied to the operational circuit, and controls the bypass current in accordance with the selected current variation pattern.

4. The power supply stabilizing circuit as set forth in claim 2, wherein
    the current control section controls the bypass current in such a manner that a time interval at which the amount of the bypass current varies is shorter during a predetermined time period from the start of the control of the bypass current than after the predetermined time period has elapsed.

5. The power supply stabilizing circuit as set forth in claim 3, further comprising:
    a current measuring section that measures a variation in a consumption current of the operational circuit during an actual operation of the operational circuit; and
    a pattern updating section that updates the plurality of types of current variation patterns prestored on the current control section, with reference to the consumption current measured by the current measuring section.

6. The power supply stabilizing circuit as set forth in claim 5, wherein
    the pattern updating section updates the plurality of types of current variation patterns with reference to the consumption current that is measured, during the actual operation of the operational circuit, by the current measuring section with the current bypass section being suspended from operating.

7. The power supply stabilizing circuit as set forth in claim 5, wherein
    the current measuring section measures the consumption current of the operational circuit in association with each of the plurality of types of operation control signals, and the pattern updating section updates the plurality of types of current variation patterns stored in association with the plurality of types of operation control signals.

8. The power supply stabilizing circuit as set forth in claim 1, wherein
the auxiliary power supply interconnection is connected to a power supply shared by a different electronic device, and
the power supply stabilizing circuit further comprises
a current reducing section that reduces a current flowing through the auxiliary power supply interconnection.

9. The power supply stabilizing circuit as set forth in claim 1, wherein
the main power supply interconnection includes a high-voltage main interconnection and a low-voltage main interconnection,
the auxiliary power supply interconnection includes a high-voltage auxiliary interconnection and a low-voltage auxiliary interconnection,
the current bypass section includes (i) a high-voltage bypass section that supplies a bypass current from the high-voltage auxiliary interconnection to the high-voltage main interconnection and (ii) a low-voltage bypass section that pulls a bypass current from the low-voltage main interconnection to the low-voltage auxiliary interconnection, and
the current control section controls the high-voltage bypass section by using a current variation pattern obtained by inverting a polarity of a current variation pattern used to control the low-voltage bypass section.

10. The power supply stabilizing circuit as set forth in claim 1, wherein
the current control section varies the bypass current in accordance with the current variation pattern that differs according to a temperature of the operational circuit.

11. The power supply stabilizing circuit as set forth in claim 1, wherein
the current control section varies the bypass current in accordance with the current variation pattern that differs according to an uninterrupted operating time period of the operational circuit.

12. An electronic device including an operational circuit and a power supply stabilizing circuit that is provided in the same chip as the operational circuit, the power supply stabilizing circuit stabilizing a power supply voltage supplied to the operational circuit, wherein
the power supply stabilizing circuit comprises:
a current bypass section that supplies a bypass current from an auxiliary power supply interconnection to a main power supply interconnection, the main power supply interconnection supplying the power supply voltage to the operational circuit, the auxiliary power supply interconnection being different from the main power supply interconnection; and
a current control section that varies an amount of the bypass current supplied by the current bypass section to the main power supply interconnection in accordance with a predetermined current variation pattern, under an external control, during an operation of the operational circuit.

13. A test apparatus for testing a device under test, comprising:
a signal input section that generates a predetermined test signal and supplies the generated predetermined test signal to the device under test; and
a judging section that judges whether the device under test is acceptable with reference to a response signal that is output from the device under test in response to the test signal,
the signal input section including:
an operational circuit that operates to generate the test signal; and
a power supply stabilizing circuit that is provided in the same chip as the operational circuit, the power supply stabilizing circuit stabilizing a power supply voltage supplied to the operational circuit, and
the power supply stabilizing circuit including:
a current bypass section that supplies a bypass current from an auxiliary power supply interconnection to a main power supply interconnection, the main power supply interconnection supplying the power supply voltage to the operational circuit, the auxiliary power supply interconnection being different from the main power supply interconnection; and
a current control section that varies an amount of the bypass current supplied by the current bypass section to the main power supply interconnection in accordance with a predetermined current variation pattern, under an external control, during an operation of the operational circuit.

* * * * *